United States Patent [19]

Tsai et al.

[11] Patent Number: 5,175,606
[45] Date of Patent: Dec. 29, 1992

[54] REVERSE SELF-ALIGNED BIMOS TRANSISTOR INTEGRATED CIRCUIT

[75] Inventors: Nun-Sian Tsai; Cliff Y. Tsai, both of Hsin-Chu, Taiwan

[73] Assignee: Taiwan Semiconductor Manufacturing Company, Hsinchu, Taiwan

[21] Appl. No.: 689,692

[22] Filed: Apr. 22, 1991

Related U.S. Application Data

[62] Division of Ser. No. 572,882, Aug. 27, 1990, Pat. No. 5,082,557.

[51] Int. Cl.$^5$ .................... H01L 29/72; H01L 27/02; H01L 23/48
[52] U.S. Cl. .................... 257/320; 257/517; 257/763
[58] Field of Search .................. 357/43, 34, 35, 67, 357/44

[56] References Cited

U.S. PATENT DOCUMENTS

| | | | |
|---|---|---|---|
| 4,209,349 | 1/1980 | Ho et al. | 357/54 |
| 4,209,350 | 6/1980 | Ho et al. | 357/54 |
| 4,234,362 | 11/1980 | Riseman | 357/59 |
| 4,256,514 | 3/1981 | Pogge | 357/36 |
| 4,366,613 | 1/1983 | Ogura et al. | 357/42 |
| 4,378,627 | 4/1983 | Jambotkar | 357/23 A |
| 4,419,810 | 12/1983 | Riseman | 357/23.3 |
| 4,536,782 | 8/1985 | Brown | 357/23.3 |
| 4,753,709 | 6/1988 | Welch et al. | 357/67 S |
| 4,778,774 | 10/1988 | Blossfeld | 357/43 |
| 4,957,874 | 9/1990 | Soejima | 357/43 |
| 4,996,581 | 2/1991 | Hamasaki | 357/35 |
| 5,061,982 | 10/1991 | Drosd et al. | 359/35 |

*Primary Examiner*—Rolf Hille
*Assistant Examiner*—Wael Fahmy
*Attorney, Agent, or Firm*—George O. Saile

[57] ABSTRACT

A method of forming self-aligned transistors wherein both bipolar and field effect transistors are formed in the same Integrated Circuit simultaneously is described. A heavily doped conductive layer of one conductivity type is formed upon a monocrystalline semiconductor substrate of the opposite conductivity type to that of the one type. The conductive layer may be typically polycrystalline silicon. An insulator layer is formed upon the surface of the conductive layer. Openings with substantially vertical sidewalls are formed through the conductive layer to the semiconductor substrate in the locations of the first element, the emitter for the bipolar and gate for the MOSFET, of the transistors to be formed. The structure is heated to form the heavily doped portions of the second element of said transistors of the one conductivity type by outdiffusing from the conductive layer. The second element is the base where the bipolar transistor is being formed and the source/drain where the field effect transistor is being formed. A uniform thickness conformal insulating layer is then deposited on the insulator layer over the conductive layer and oxidized substrate and preferentially removing the insulating layer from the horizontal surfaces and leaving a sidewall insulating layer upon the substantially vertical sidewalls. The integrated circuit is completed and the appropriate electrical contacts are made to the transistors of the IC.

10 Claims, 4 Drawing Sheets

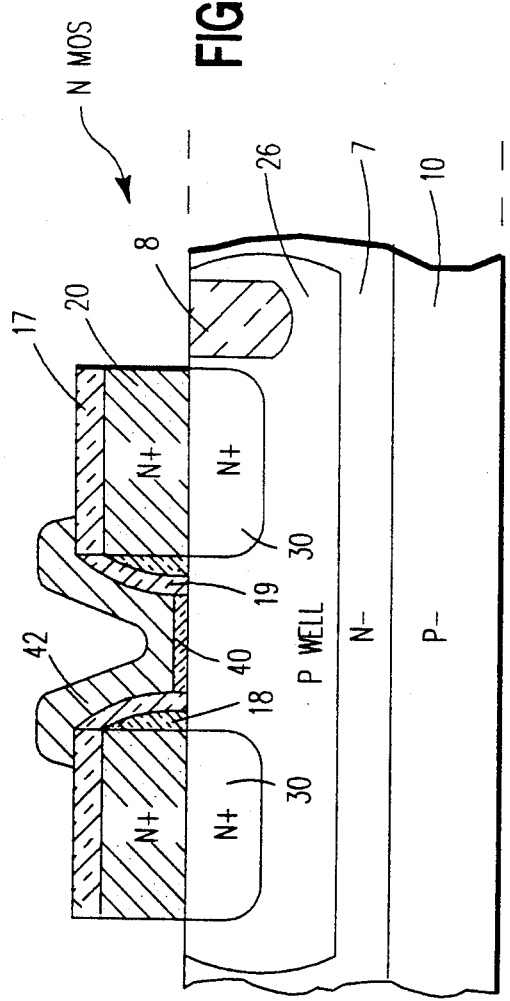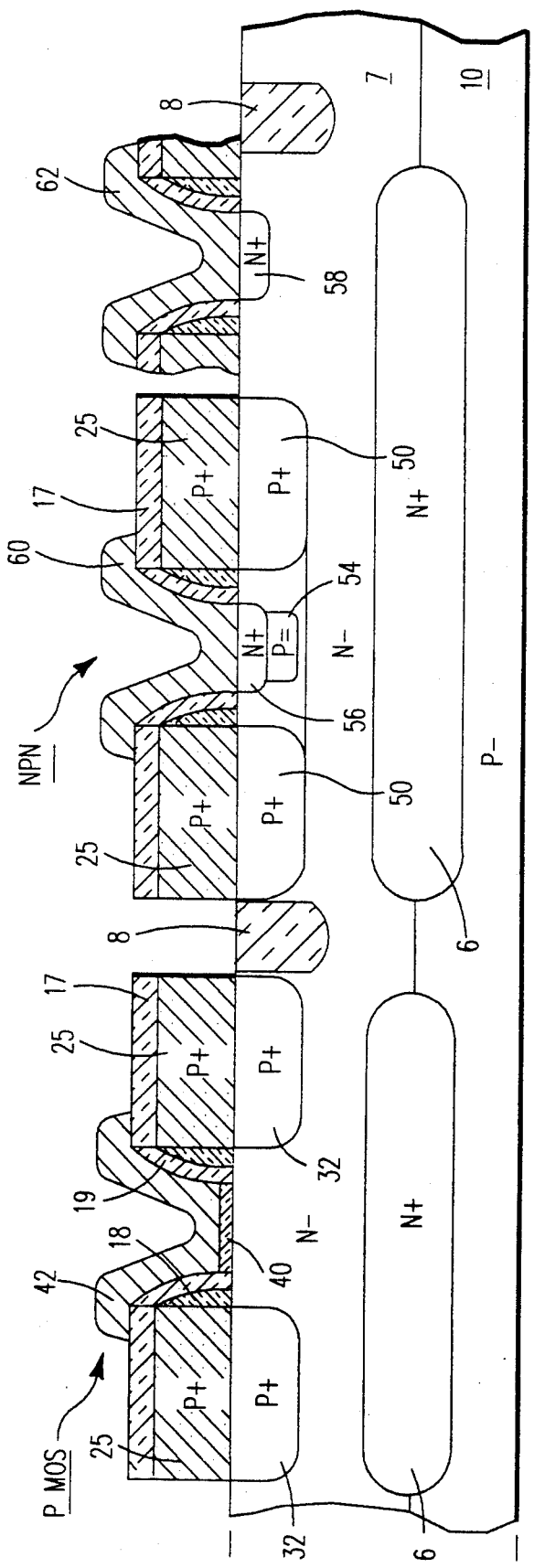

REVERSE SELF-ALIGNED BIMOS TRANSISTOR INTEGRATED CIRCUIT

This application is a divisional of 07/572,882 filed Aug. 27, 1990 now U.S. Pat. No. 5,082,557.

TECHNICAL FIELD

This invention relates to semiconductor integrated circuit bipolar and MOS FET structures and to methods for manufacturing such integrated circuits wherein self-aligned transistor structures are formed.

DESCRIPTION OF THE PRIOR ART

The self-aligned silicon gate field effect transistor process and resulting structure has been a standard in the industry for some time. The process involves growing an insulating layer over the semiconductor substrate and then forming a polysilicon layer thereover. Lithography and etching techniques are used to remove all of the polysilicon layer except in the areas where the field effect transistor gates are to be located in the integrated circuit structure. This resulting gate structure is now used as a mask for forming the source/drain of the transistor in what is termed a self-aligned structure.

Improvements have been made in the self-aligned processing and structures. These improvements are particularly important in the manufacture of submicron integrated circuits.

One such improvement field has been for methods to form narrow dimensioned, for example submicron regions on a semiconductor body. Reference is made to the I. T. Ho et al U.S. Pat. Nos. 4,209,349 and 4,234,362, K. Riseman U.S. Pat No. 4,234,362 and the H. B. Pogge U.S. Pat. No. 4,256,514 which describe the formation of such regions. These patents all involve the formation of substantially horizontal surfaces and substantially vertical surfaces on a silicon body and then forming a layer of a very narrow dimension on both the substantially horizontal and substantially vertical surfaces. This layer is then subjected to an anisotropic etching process such as by reactive ion etching, to substantially remove the horizontal layer while leaving the vertical layer substantially intact. The vertical layer dimension is adjusted depending upon the original thickness of the layer applied. In this way such a narrow dimension region of one micrometer or less is obtained.

Another improved self-aligned gate structure is the lightly doped drain or LDD. For example, where the LDD in an N channel MOS FET is included, in addition to the channel separating implanted N+ source and drain regions, the submicron diffused N− regions. These N− regions increases the channel breakdown voltage and reduces drain junction electron impact ionization (and thus, hot electron emission) by spreading the high electric field at the drain pinch-off region into the N− region. One improved process for making such an LDD device is described in the S. Ogura et al U.S. Pat. No. 4,366,613 in which the N− region is first formed using the polysilicon gate as the mask, submicron sidewall spacers are formed on the sides of the polysilicon gate, and the N+ source/drain regions are formed by ion implantation using the gate and sidewall spacer structure as the mask which results in the N− LDD structure. Other lightly doped drain structures and methods are shown by the I. T. Ho et al U.S. Pat. Nos. 4,209,349 and 4,209,350.

The reverse self-aligned field effect transistor process has been suggested by a limited number of workers in the field. Reference is made to the U.S. Pat. Nos. 4,296,426 to Thomson CSF, 4,378,627 to C. G. Jambotkar, 4,419,810 to J. Riseman and 4,546,535 to C. G. Jambotkar. These patents generally describe the reverse process wherein a heavily doped conductive layer such as polycrystalline silicon or the like is formed upon a silicon substrate and an insulator layer formed thereover. This multilayer structure is etched to result in a patterned conductive polycrystalline layer or the like with substantially vertical sidewalls. The pattern of the conductive layer is chosen to be located above the planned source/drain regions with openings in the pattern at the location of the field effect transistor's channel. A sidewall insulator spacer can now be formed on the vertical sidewalls as described, for example in the previous paragraphs. The sidewall layer may be doped with conductive imparting impurities. The gate dielectric is formed on the channel surface. The source/drain region and preferably lightly doped region are simultaneously formed by thermal drive-in from the conductive first polycrystalline silicon layer or the like and insulator sidewall layer respectively. The desired gate electrode is formed upon the gate dielectric and electrical connections made to the various elements of the field effect transistor devices.

Combination formation of both Bipolar transistors and MOS field effect transistors in the form of NPN transistors or CMOS field effect transistors have also been well understood in the standard self aligned MOS FET technology. However, the use of the reverse self aligned technology to form Bipolar transistors and MOS FET or CMOS FET devices on the same Integrated Circuit has not been known, It is therefor an object of this invention to make improvements in the reverse self-aligned process and resulting devices useful in the submicron Bipolar and MOSFET integrated circuit technology.

A further object of the invention is to make improvements in the reverse self-aligned process for making submicron Bipolar-MOSFET integrated circuits.

It is a still further object of this invention to make improvements in the reverse self-aligned process for making submicrom Bipolar-LDD MOSFET integrated circuits.

SUMMARY OF THE PRESENT INVENTION

In accordance with the present invention a method of forming self-aligned transistors wherein both bipolar and field effect transistors are formed in the same Integrated Circuit simultaneously is described. A heavily doped conductive layer of one conductivity type is formed upon a monocrystalline semiconductor substrate of the opposite conductivity type to that of the one type. The conductive layer may be polycrystalline silicon, tungsten silicide, titanium nitride or the like. An insulator layer is formed upon the surface of the conductive layer. Openings with substantially vertical sidewalls are formed through the conductive layer to the semiconductor substrate in the locations of the first element, the emitter for the bipolar and gate for the MOSFET, of the transistors to be formed. The structure is heated to form the heavily doped portions of the second element of said transistors of the one conductivity type by outdiffusing from the conductive layer. The second element is the base where the bipolar transistor is being formed and the source/drain where the field effect transistor is being formed. A uniform thickness conformal insulating layer is then deposited on the insulator layer over the conductive layer and oxidized substrate and preferentially removing the insulating layer from the horizontal surfaces and leaving a sidewall insulating layer upon the substantially vertical sidewalls. The integrated circuit is completed and the appropriate electrical contacts are made to the elements of the transistors of the integrated circuit.

Further, in accordance with the present invention a method of forming self-aligned transistors wherein both bipolar and field effect transistors are formed in the same Integrated Circuit simultaneously is described. A heavily doped conductive layer of one conductivity type is formed upon a monocrystalline semiconductor substrate of the opposite conductivity type to that of the one type. The conductive layer may be polycrystalline silicon, tungsten silicide, titanium nitride or the like. An insulator layer is formed upon the surface of the conductive layer. Openings with substantially vertical sidewalls are formed through the conductive layer to the semiconductor substrate in the locations of the first element, the emitter for the bipolar and gate for the MOSFET of the transistors to be formed. The structure is heated to form the heavily doped portions of the second element of said transistors of the one conductivity type by outdiffusing from the conductive layer. Controlled oxidation of the exposed substrate and sidewalls of the conductive layer is done until the desired low doped portion of the heavily doped portions of the second element of the transistor has been formed under the oxidized semiconductor substrate. This second element is the base where a bipolar transistor is formed by an ion implant before the formation of the polysilicon layer. The second element is the source/drain with LDD where a field effect transistor is being formed. A uniform thickness conformal insulating layer is then deposited on the insulator layer over the conductive layer and oxidized substrate and preferentially removing the insulating layer from the horizontal surfaces and leaving a sidewall insulating layer upon the substantially vertical sidewalls. The integrated circuit is completed and the appropriate electrical contacts are made to the elements of the transistors of the integrated circuit.

A self-aligned bipolar—MOSFET transistor integrated circuit device structure is also envisioned by this invention. This structure includes a silicon semiconductor substrate having dielectric regions that isolate semiconductor surface regions from one another. Heavily doped regions of one conductivity are located in some of the semiconductor surface regions which are of an opposite conductivity. These regions are bases in the bipolar ares and source/drains in the MOSFET areas. Directly above the heavily doped regions are heavily doped conductive layers which are of the same one conductivity and the source of the dopant in the heavily doped regions. There are substantially vertically sided openings in the heavily doped layers having insulating sidewall layers on the vertically sided openings. There are no heavily doped regions in the said semiconductor surface regions under the opening. Means are provided for connecting the remaining elements, that is the emitters and collectors at the designated openings of the bipolar regions and the gates in the opening in the MOSFET regions, of the transistors. Appropriate electrical contact means are made to the elements to form the completed integrated circuit structure.

Another self-aligned bipolar—MOSFET transistor integrated circuit device structure is also envisioned by this invention. This structure includes a silicon semiconductor substrate having dielectric regions that isolate semiconductor surface regions from one another. Heavily doped regions of one conductivity are located in some of the semiconductor surface regions which are of an opposite conductivity. These regions are bases in the bipolar ares and source/drains in the MOSFET areas. Directly above the heavily doped regions are heavily doped conductive layers which are of the same one conductivity and the source of the dopant in the heavily doped regions. There are substantially vertically sided openings in the heavily doped layers having insulating sidewall layers on the vertically sided openings. There are no heavily doped regions in the said semiconductor surface regions under the opening. Thermal silicon dioxide regions are at the surface and on the inner periphery of the heavily doped regions near the openings. Lightly doped regions of the one conductivity are located directly under the thermal silicon dioxide regions. Means are provided for connecting the remaining elements, that is the emitters and collectors at the designated openings of the bipolar regions and the gates in the opening in the MOSFET regions, of the transistors. Appropriate electrical contact means are made to the elements to form the completed integrated circuit structure.

BRIEF DESCRIPTION OF THE DRAWINGS

The drawings show the following:

FIGS. 1 through 5(A and B) schematically illustrate in a vertical cross-sectional representation a first embodiment of the process for forming a self-aligned, submicron bipolar—CMOS field effect transistor integrated circuit structure.

DISCLOSURE OF THE INVENTION

Figure 1:
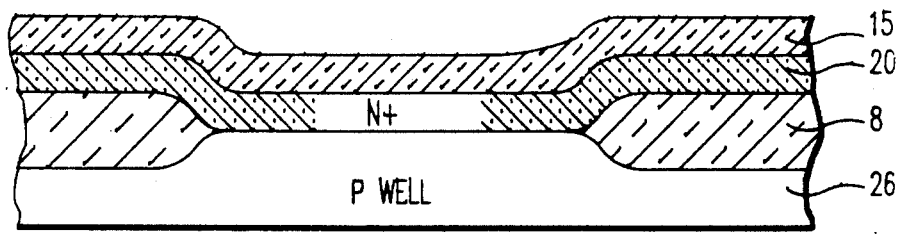

Referring now more particularly to FIGS. 1 through 5 there is shown a first embodiment for making a submicron bipolar—field effect transistor in a high density integrated circuit structure. The process is illustrated to form a vertical NPN bipolar, an N channel MOS FET and P channel MOS FET integrated circuit. FIG. 5 schematically shows the overall integrated circuit structure. The FIGS. 1 through 4 show the process in the N channel portion of FIG. 5 in an effort to simplify the drawings.

The first series of steps form the buried N+ subcollector 6 and the N− epitaxial layer 7 on the P− substrate 10. These structures are formed by conventional processes as described, for example in the above mentioned I. T. Ho. U.S. Pat. No. 4,209,350. The semiconductor substrate 10 may be composed of any of the various known semiconductor materials, but is preferably composed of silicon having a (100) crystallographic orientation. The substrate 10 in this example is doped P− as seen in FIG. 5. Briefly, the process involves forming a N+ subcollector region in the P− substrate using standard silicon dioxide masking with lithographic and etching techniques. The N+ subcollector is positioned in the areas where the bipolar transistors are planned to be formed. The subcollector can also be located under the planned P channel FETs. The subcollector 6 is completed during the N− epitaxial layer 7 growth. The dopant used in the subcollector is usually arsenic and the epitaxial growth process is conventionally done by using silicon tetrachloride/hydrogen or silane/hydrogen mixtures at temperatures about 1000° to 1200° C.

The next series of steps involve the formation of the dielectric isolation regions for isolating semiconductor surface regions from other such regions. This may be understood with reference to FIGS. 1 through 4. The dielectric isolation regions 8 may be formed by the various conventional methods understood by those skilled in the field. One method is described by E. Kooi in U.S. Pat. No. 3,970,486 wherein the certain selected surface portions of a silicon semiconductor substrate is masked against oxidation, and then the exposed unmasked surface is oxidized to grow a thermal oxide which in effect sinks the silicon surface at the unmasked areas. The masked silicon remains as a mesa surrounded by the sunken oxide. Then semiconductor devices can be provided by various known techniques in the silicon mesas. The isolation pattern 8 shown in FIGS. 1 through 5 is of this type. However, in FIG. 5 in an effort to conserve space the isolation pattern 8 is shown schematically an without the characteristic shape that is shown in FIGS. 1 through 4.

The portions of the surface other than the areas designated to have N channel FETs formed therein are masked by, for example a silicon dioxide layer. The N channel areas now has implanted boron ions therein at a dose sufficient to provide P type impurities for forming the P Well 26. The mask layer is now removed. This is a conventional process such as shown in the L. C. Parrillo et al U.S. Pat. No. 4,435,896.

A first layer 20 of polycrystalline silicon is deposited over the entire surface having the dielectric isolation pattern 8. The layer 20 is deposited by conventional methods at preferably as low a temperature as possible. The polycrystalline silicon can be deposited either doped or undoped and subsequently doped by an ion implantation process using phosphorous to form N+ or boron to form P+ polysilicon. However, in the present example the N+ doped and P+ polysilicon is required. It is preferred to use the process of deposition of the undoped polysilicon and subsequent ion implantation of phosphorous and boron in the designated areas of polysilicon layer 20 that are to be N+ and P+. The designated areas of P+ and N+ can be seen in FIG. 5. The thickness of the polysilicon layer is preferably between about 0.2 and 0.5 micrometers and is typically 0.3 micrometers. A silicon nitride layer 15 is now deposited thereover by any conventional technique. It is preferably between about 0.1 and 0.5 micrometers in thickness and is typically 0.15 micrometers.

Figure 2:
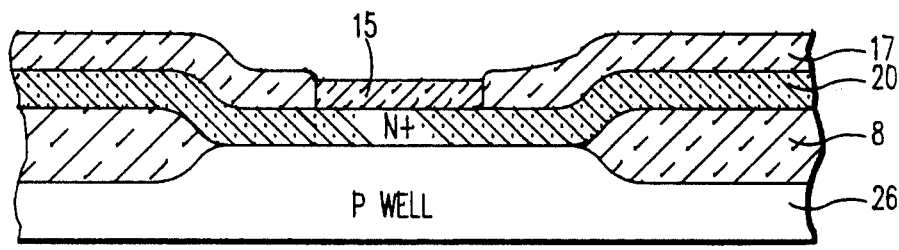
Figure 3:
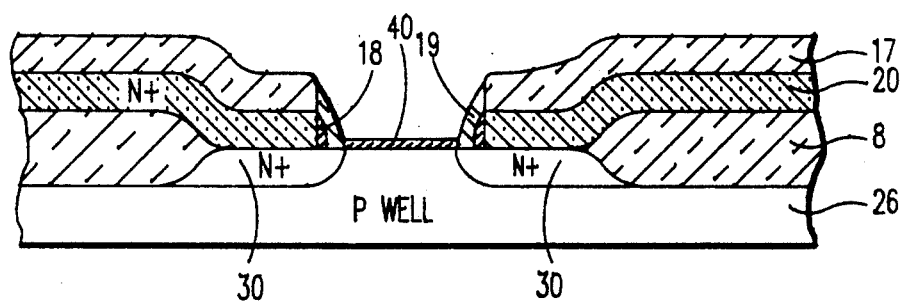

Referring now more particularly to FIG. 2, the layer 20 is etched by standard lithography and etching techniques to form the desired openings therein. The silicon nitride layer 15 is first patterned so that it remains only above the areas where openings are desired in layer 20. Then layer 15 is used as oxidation mask for layer 20 in an oxidation atmosphere to produce an silicon dioxide layer 17 of between about 0.2 and 0.4 micrometers and typically 0.3 micrometers upon polysilicon layer 20 as shown in FIG. 2. The layer 15 is now removed by conventional etching. The etching of the polycrystalline silicon layer 20 is now accomplished by an anisotropic etching process as is known in the art to obtain substantially vertical sided opening in this layer 20 as seen in FIG. 3. A chemical, wet etch can be used to remove the last of the polycrystalline silicon layer 20. The pattern of openings in layer 20 are chosen to be located above the location of the field effect transistors' channel and the planned source/drain regions under the remaining layers and adjacent to the channel areas and above the location of the bipolar transistor's emitter and collector regions and adjacent to its base region.

The next series of steps may be more fully understood with reference to FIG. 3. The reverse self aligned gate and emitter structures are now to be formed. The sidewall insulator structure is formed by first depositing a silicon dioxide uniform thickness layer of about 0.05 to 0.3 micrometers and preferably of about 0.1 micrometers by the conventional TEOS deposition process at about 720° C. Anisotropic etching removes the horizontal portions of the layer and leaves the vertical portions 18 of the silicon dioxide layer. A layer of silicon nitride is now deposited by conventional techniques to produce a layer of between about 0.05 to 0.3 micrometers and preferably of about 0.1 micrometers.

The N+ source/drain regions 30 are now formed by annealing the FIG. 3 structure of between about 900° C. to 1000° C. until the N+P+ junction is about 0.3 to 0.6 micrometers below the surface. The P+ source/drain regions 32 for the P channel FET as seen in FIG. 5 are also formed during this step. Annealing is done in an nitrogen atmosphere for about 60 minutes. Anisotropic etching removes the horizontal portions of the layer and leaves the vertical portions 19 of the silicon nitride layer. The P+ base region 50 of the bipolar transistor is formed at this time by the same mechanism of outdiffusion. The bipolar portion of the structure is seen in FIG. 5. It should be understood that the MOS FET devices and bipolar devices are on different portions of the Integrated Circuit layout.

The gate dielectric layer 40 of the field effect transistors are formed by thermal oxidation in a oxidizing atmosphere such as oxygen or oxygen/water vapor ambient at about 950° C. The preferred thickness is about 0.025 micrometers. This gate oxide is then removed by a wet dip etch in the bipolar transistor areas using a photoresist block out mask to block out the FET areas from the effect of the etchant.

Referring now to FIG. 5A and 5B which shows the bipolar portion of the BICMOS Integrated Circuit that is being simultaneously formed with the N channel MOSFET shown in the FIG. 1 through 4 description above. When it is time to form the N— (or P—) region 54, it is necessary to use a conventional block out mask over the collector regions and MOSFET regions to avoid ion implantation of the impurities in these regions. The formation of region 54 is accomplished by an implant dose in the range of about $1 \times 10^{13}$ to $1 \times 10^{14}$ atoms/cm$^3$ at the appropriate and conventional energy. The block out mask is then removed by conventional etching.

The N+ (or P+) emitter region 56 is implanted at the same time as the N+ (or P+) collector contact region 58. Alternatively, the N+ (or P+) emitter and collector regions can be formed by outdiffusion from a deposited and heavily N+ (or P+) doped polysilicon II (Poly II) layer. The polysilicon II layer is then delineated to form the contacts to the emitter, collector and the gate contact. The base doping is approximately 0.2 micrometers deep with doping peak of $1 \times 10^{17}$ atoms/cm$^3$. The emitter junction is formed by out-diffusion from the Poly II and can be less than 0.1 micrometers deep with concentration higher than about $1 \times 10^{20}$ atoms/cm$^3$.

An alternative to the above described process is a double out-diffusion technique to eliminate the base implant and to achieve highest emitter gain. In this process, both boron and arsenic are implanted into Poly II layer 20. Since boron diffuses faster than arsenic, boron's junction will be deeper than that of arsenic upon a uniform temperature driven cycle. By carefully controlling the temperature cycle, base and emitter can be formed at the same time. Using this process a very high gain, narrow base transistor can be obtained.

The second polycrystalline silicon layer or the like needed to form the gate electrode 42, the emitter contact layer 60 and collector contact layer 62 may be now deposited in a similar fashion to that of the first polycrystalline silicon layer 20 described above. The second polycrystalline layer is blanket deposited over the FETs, emitter, collector and oxide layer 17 and then it is delineated by conventional lithography and etching techniques. The delineated layer is then thermally oxidized or has an insulating layer such as a borosilicate glass (not shown) formed thereover which results in the FIG. 4 and FIG. 5A and 5B N channel MOS FET, P channel MOS FET and NPN bipolar integrated circuit structure. Obviously, by the interchanging of the N and P regions of the FIG. 5, a PNP vertical bipolar devices can be formed.

Figure 4:
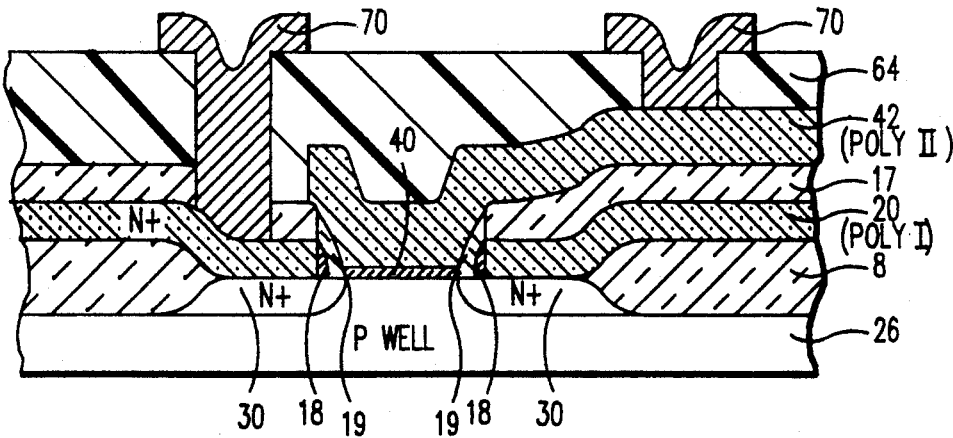
Figure 6:
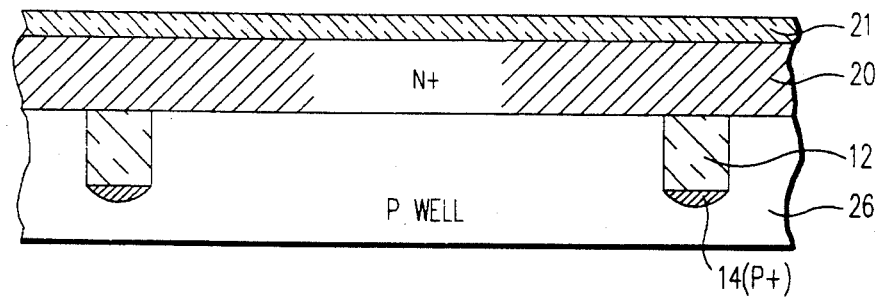
FIGS. 6 through 11 schematically illustrates a vertical cross-sectioned representation a second embodiment of the process for forming a self-aligned, submicron bipolar—field effect transistor integrated circuit structure.

This FIG. 4 and FIG. 5A and 5B embodiment requires a higher level of metallurgy to contact the elements of the transistors, that is the emitter electrode 60, the base contact layer 20 and the collector electrode 62; and the MOS FET source/drain and gate contacts as appropriate in the desired circuit structures. This metallurgy level is preferably aluminum or the like. Passivation and insulation between the metallurgy levels are required in the desired conventional manners known in the art.

Figure 7:
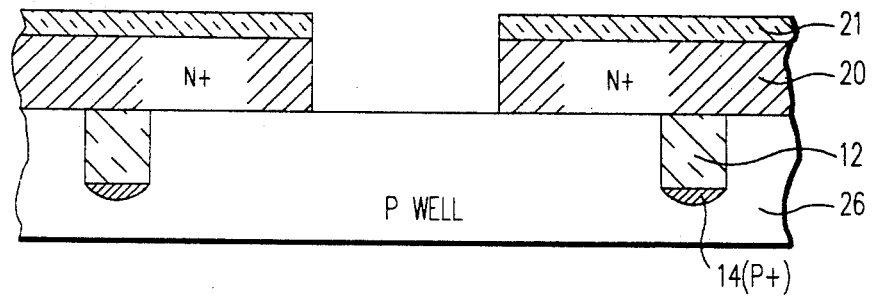
Figure 8:
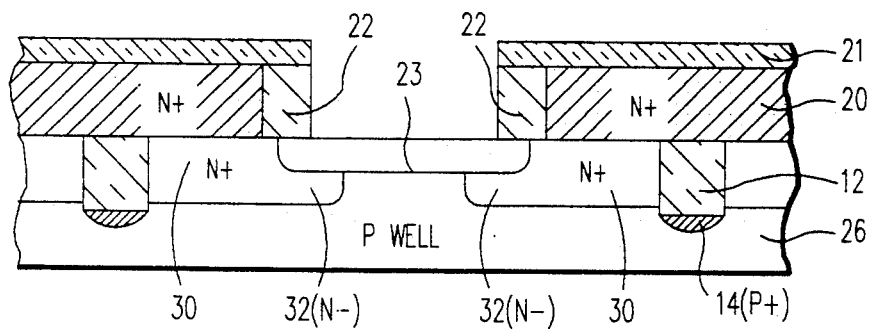
Figure 9:
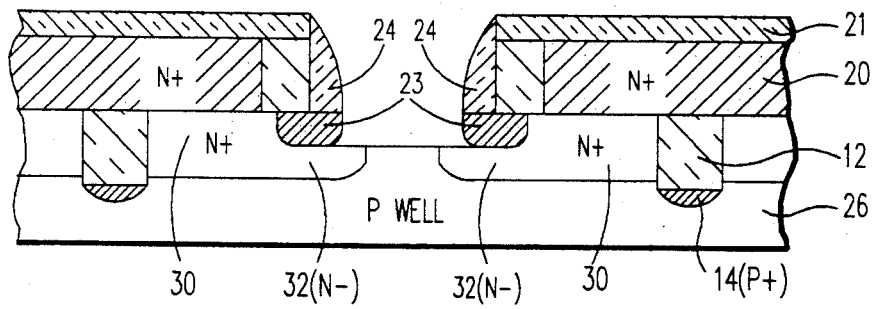
Figure 10:
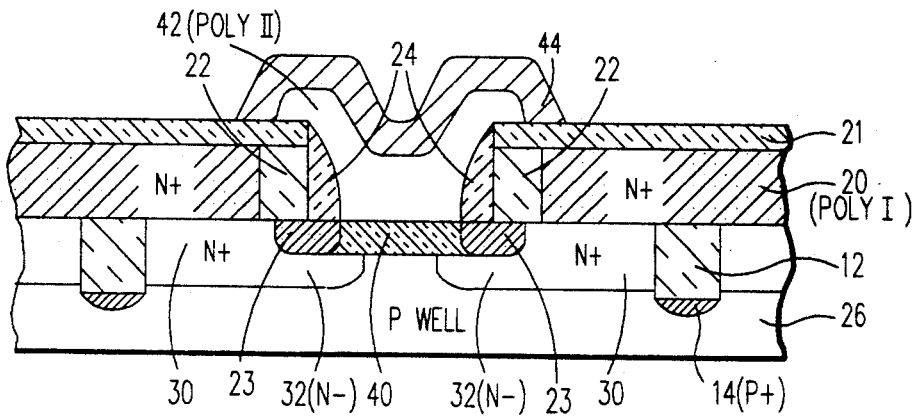
Figure 11:
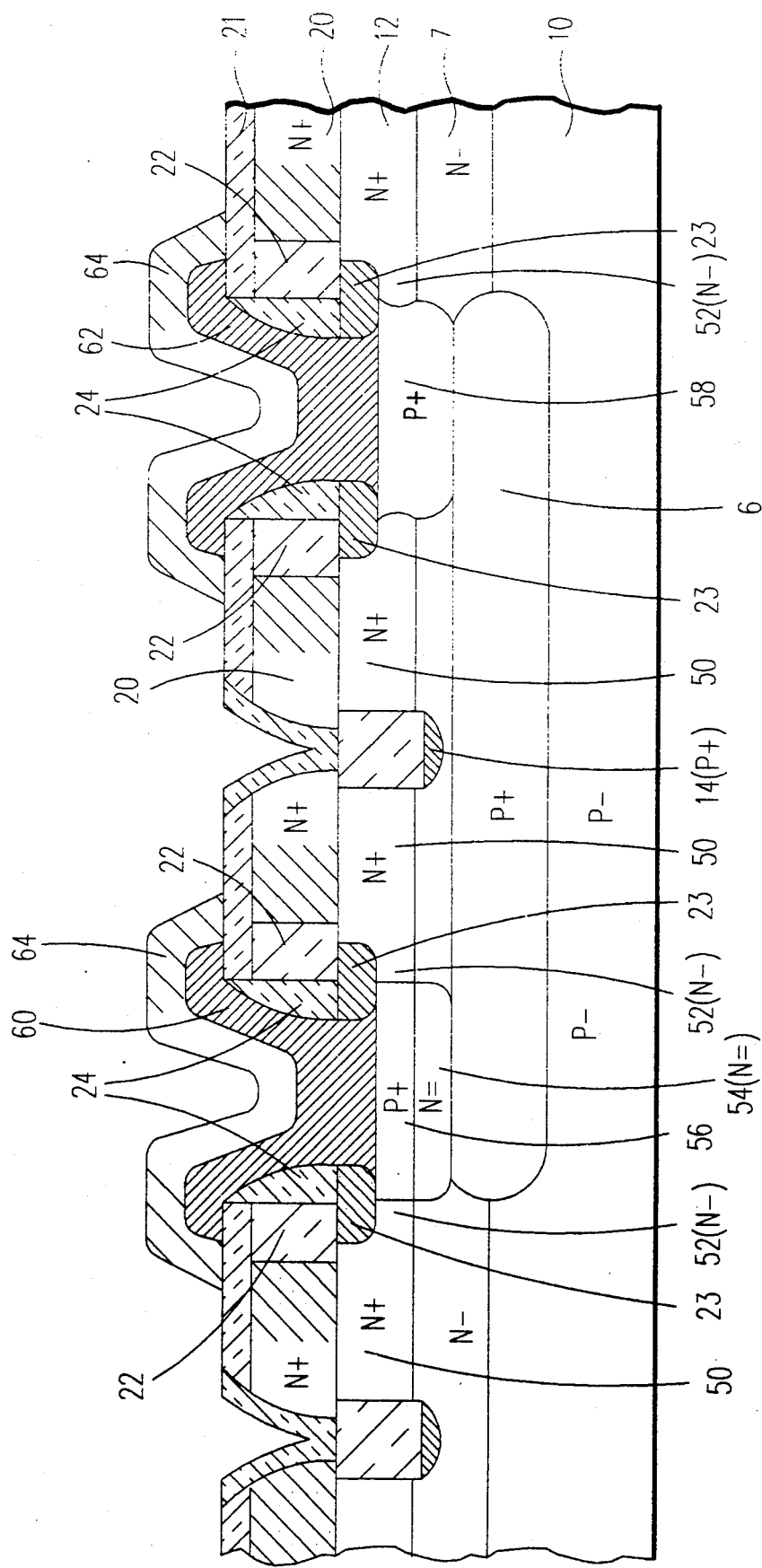

Referring now more particularly to FIGS. 6 through 11 there is shown a second embodiment for making a submicron bipolar—field effect transistor in a high density integrated circuit structure. "Note that FIGS. 8-10 are specific to the formation of the MOSFET portion of the integrated circuit and FIG. 11 is the resulting bipolar transistor portion of the integrated circuit." The process is illustrated to form a vertical PNP bipolar—N channel, lightly doped drain (LDD) MOSFET integrated circuit. However, it should be understood that an NPN bipolar—P channel field effect transistor can be formed by simply reversing the polarity of the various elements of the transistors and associated regions.

The first series of steps form the buried subcollector 6 in the epitaxial layer 7 which is formed on the substrate 10 as described in the first embodiment above.

The next series of steps involve the formation of the dielectric isolation regions for isolating semiconductor surface regions from other such regions. The semiconductor substrate 10 may be composed of any of the various known semiconductor materials, but is preferably composed of silicon having a (100) crystallographic orientation. The substrate 10 in this example is doped P— as seen in FIG. 11. The dielectric isolation regions 12 may be formed by the various conventional methods understood by those skilled in the field. One method is described by E. Kooi in U.S. Pat. No. 3,970,486 and used in the FIG. 1 through 5 first embodiment described above. A second and preferred method for submicron integrated circuit devices in this second embodiment is described by J. A. Bondur et al. in U.S. Pat. No. 4,104,086 can be used to form the dielectric regions 12. A P+ region 14 is usually formed under the dielectric isolation region 12 to prevent a formation of an inversion layer and the resulting electrical leakage between isolated monocrystalline surface regions under the dielectric regions 12.

The dielectric isolation regions 12, 14 may be formed according to the Bondur et al technique by first thermally oxidizing the surface of the silicon substrate 10 to form silicon dioxide layer (not shown) thereon. A silicon nitride layer (not shown) is then deposited thereover by chemical vapor deposition. The silicon nitride layer then has openings formed therein at the desired locations of the dielectric isolation regions by conventional lithography and etching techniques. Openings are formed in the silicon dioxide layer using the silicon nitride layer as a mask. Then the structure is subjected to a reactive plasma to etch the silicon to a desired depth using the silicon nitride-silicon dioxide layers as a mask. The etched grooves are filled with the desired dielectric such as thermally grown silicon dioxide, chemical vapor deposited silicon dioxide, polysilicon, monocrystalline silicon, glass, silicon nitride or organics such as polyimides or the like either singularly or in combinations before or after the formation of device structures. One example of a filled dielectric groove is a thermal dioxide layer on the trench sidewalls with the remaining filling being polycrystalline silicon. The P+ region 14 is formed by the ion implantation of boron before the groove is filled with the dielectric materials. The silicon dioxide and silicon nitride layers are now removed from the surface of the silicon substrate. The surface dielectric isolation regions 12, 14 are now completed.

The portions of the surface other than the areas designated to have N channel FETs formed therein are masked by, for example a silicon dioxide layer. The N channel areas now has implanted boron ions therein at a dose sufficient to provide P type impurities for forming the P Well 26. The mask layer is now removed. This is a conventional process such as shown in the L. C. Parrillo et al U.S. Pat. No. 4,435,896.

The layer 20 is now formed upon the surface of the semiconductor 10 as described in the first embodiment above. The like numbers used hereinafter to those used in the first embodiment mean that these elements are the same. A silicon dioxide layer 21 is now deposited thereover by any conventional technique, but preferably by plasma oxide deposition at about 350° C. It is preferably between about 0.2 and 0.5 micrometers in thickness and is typically 0.3 micrometers.

Referring now more particularly to FIG. 7, the layer 21 is etched by standard lithography and etching techniques form the desired opening therein. The silicon dioxide layer 21 is then used as a mask to form the opening in the polysilicon layer 20 as seen in FIG. 7. The layer 21 remains a part of the resulting structure. The openings are made where the gate/channel regions of the MOS FET devices are desired and where the emitters and collectors regions of the bipolar devices are desired.

The N+ source/drain regions 30 and base regions 50 are now formed by annealing the FIG. 7 structure at between about 900° C. to 1000° C. until the N+P+ junction is about 0.3 to 0.6 micrometers below the surface. Annealing is done in an nitrogen atmosphere for about 60 minutes.

The next series of steps will produce the FIG. 8 structure. The FIG. 7 structure is subjected to a carefully controlled thermal oxidation step in oxygen or water vapor at a temperature of about 970° C. until about 0.4+0.02 micrometers of silicon dioxide is grown from the polysilicon layer 20 to produce oxide region 22 and from the substrate 10 to produce the oxide region 23. The effect of the oxidation region 23 is to consume the most heavily doped upper portion of the N+ doped region of the source/drain contiguous to the planned channel and base region contiguous to the emitter and collector regions. This leaves the desired N-regions 32 under the oxide region 23 in the MOS FET device areas.

A sidewall insulator layer or spacer 24 is formed upon the vertical sidewalls of the silicon dioxide layer 22. This layer 24 is preferably silicon dioxide, but could alternatively be composed of silicon nitride or the like or a combination of silicon hydride and silicon nitride. The sidewall layer 24 may be formed by a conformal chemical vapor deposition process wherein silicon nitride, oxygen at about 450° C. or silicon bichloride and nitrogen dioxide at about 800° C. at atmospheric or low pressure conditions are used. Alternatively, the conventional TEOS process at a temperature of 720° C. is used to deposit silicon dioxide from the ambient. The resulting conformal layer is deposited over the layer 21, sidewalls 22 of the opening and the bottom of the opening over layer 23. This conformal layer which is not shown in the drawings is now subjected to an anisotropic etching process for silicon dioxide or whatever the conformal layer is composed of. The conformal layer thickness is preferred to be about 0.2 +0.01 micrometers. The process continues until the horizontal portions of the conformal layer has been removed and only the remaining vertical portions of the conformal layer 24 remains as seen in FIG. 9. The etching may be done, for example in a reactive ion etching system using carbon tetrafluoride and hydrogen as described in L. M. Ephrath, J. Electrochem. Soc, Vol. 124, p. 284C (1977). The result of the etching step is to remove about 0.5+0.04 micrometers of silicon dioxide which leaves about 0.1+0.07 micrometers in the gate region. A wet hydroflouric acid etch is used to remove this remaining silicon dioxide in the gate region in preparation for forming the gate dielectric and in the emitter and collector regions in preparation for forming the contacts thereto. The result of these processes is shown in FIGS. 9 and 11.

In preparation for forming the gate dielectric for the MOS FET devices, a block out mask is formed over the bipolar device regions by conventional means. The gate dielectric layer 40 of the field effect transistor is formed by thermal oxidation in an oxidizing atmosphere such as oxygen or oxygen/water vapor ambient at about 950° C. The preferred thickness of the gate dielectric layer 40 is between about 0.025 and 0.01 micrometers. The block out mask is now removed by conventional etching means. "The resulting layer 40 is shown in FIG. 10."

Referring now to FIGS. 10 and 11 which shows the bipolar and MOS FET portions of the BIMOS Integrated Circuit that is being simultaneously formed with the NPN MOSFET. When it is time to form the N− region 54, it is necessary to use a conventional block out mask over the collector regions and MOSFET regions to avoid ion implantation of the N− impurities in these regions in a similar fashion to that described in regard to the first embodiment.

The P+ emitter region 56 is implanted at the same time as the P+ collector contact region 58 or alternatively, the P+ emitter and collector regions can be formed by outdiffusion from a deposited and heavily P+ doped polysilicon II layer as was described in regard to the first embodiment. The polysilicon II layer is then delineated to form the contacts to the emitter, collector and the gate contact.

The second polycrystalline silicon layer or the like needed to form the gate electrode 42, the emitter contact layer 60 and collector contact layer 62 may be now deposited in a similar fashion to that of the first polycrystalline silicon layer 20 described above and as described in regard to the first embodiment. It is delineated by conventional lithography and etching techniques. The delineated layer is then thermally oxidized or has an insulating layer such as a borosilicate glass 64 formed thereover which results in the FIG. 10 and FIG. 11 N channel MOS FET and PNP bipolar integrated circuit structure. Obviously, by the interchanging of the N and P regions of the FIG. 10 and 11 the PNP vertical bipolar devices and N channel MOS FET devices, it is possible to form a NPN vertical bipolar devices and P channel MOS FET devices.

This FIG. 10 and FIG. 11 embodiment requires a higher level of metallurgy to contact the elements of the transistors, that is the emitter electrode 60, the base contact layer 20 and the collector electrode 62; and the MOS FET source/drain and gate contacts as appropriate in the desired circuit structures. This metallurgy level is preferably aluminum or the like. Passivation and insulation between the metallurgy levels are required in the desired conventional manners known in the art.

To further improve the conductivity of the device, the first and second polycrystalline silicon layers may be replaced with refractory metal silicide, such as tungsten silicide, tantalum silicide, palladium silicide or the like, and/or in combination with doped polycrystalline silicon.

While the invention has been particularly shown and described with reference to the preferred embodiments thereof, it will be understood by those skilled in the art that various changes in form and detail may be made therein without departing from the spirit and scope of the invention.

What is claimed is:

1. A self-aligned bipolar-MOS field effect transistor integrated circuit structure comprising:
   a silicon semiconductor substrate having dielectric regions that isolate semiconductor surface regions from one another;
   heavily doped source/drain regions of one conductivity in at least some of said semiconductor surface regions which are of an opposite conductivity;
   directly above said heavily doped regions are heavily doped conductive layers which are of the same one conductivity and the source of the dopant in said heavily doped regions;
   heavily doped base regions of one conductivity in at least some of said semiconductor surface regions which are of an opposite conductivity;
   directly above said heavily doped regions are heavily doped conductive layers which are of the same one conductivity and the source of the dopant in said heavily doped regions;

substantially vertically sided self-aligned openings in said heavily doped layers having a insulating sidewall layer on the said vertically sided openings; there are no said heavily doped regions in the said semiconductor surface regions under the said openings; thermal silicon dioxide regions at the surface and on the inner periphery of the said heavily doped regions near the said openings to force current flow away from the surface of the said integrated circuit structure; said insulating sidewall layer being only on said vertically sided openings and being directly above said thermal silicon dioxide regions;

said openings are at the bipolar emitter and collector regions and the field effect transistor channel and gate regions and said thermal silicon oxide regions being of the same depth for both bipolar and field effect transistor regions;

a gate electrode over the gate dielectric and in said openings in the field effect transistor regions; emitter and collector regions at the base of the said openings in said bipolar transistor regions; and means for electrically contacting the elements of the field effect and bipolar transistors to complete the said integrated circuit structure.

2. The self aligned bipolar—MOS field effect transistor integrated circuit structure of claim 1 wherein said bipolar transistor is a vertical PNP, said field effect transistor is N channel, and an N− ion implantation is located under the P+ emitter.

3. The structure of claim 1 wherein the said conductive layer is polycrystalline silicon, the semiconductor substrate is silicon, and said polycrystalline silicon layer is N+ type conductivity imparting impurity, the said base and said source/drain regions are N+ and said bipolar transistors are vertical PNP.

4. The structure of claim 3 wherein said polycrystalline silicon conductive layer includes a top portion of a refractory metal silicide.

5. The structure of claim 1 and further comprising a second polycrystalline silicon layer which is patterned and makes contacts to the said gate electrodes, emitter and collector of the said self aligned transistors; and a next level patterned conductor which completes said making contacts to the elements of said integrated circuit step.

6. A self aligned bipolar—MOS field effect transistor integrated circuit structure comprising:
  a silicon semiconductor substrate having dielectric regions that isolate semiconductor surface regions from one another;
  heavily doped regions of one conductivity in at least some of said semiconductor surface regions which are of an opposite conductivity;
  separate regions in and on said integrated circuit structure containing said bipolar transistors and other regions containing said MOS field effect transistors; directly above said heavily doped regions are heavily doped conductive layers which are of the same one conductivity and the source of the dopant of the dopant in said heavily doped regions;
  said heavily doped regions in said bipolar regions are base regions and said heavily doped conductor regions are the base contacts;
  said heavily doped regions in said field effect transistor regions are the source/drain regions and said heavily doped conductor regions are the source/drain contacts; substantially vertically sided openings in said heavily doped layers having a insulating sidewall layer on the said vertically sided openings;
  there are no said heavily doped regions in the said semiconductor surface regions under the said openings; thermal silicon dioxide regions at the surface and on the inner periphery of the said heavily doped regions near the said openings to force current flow away from the surface of the said integrated circuit structure; said thermal silicon oxide regions being of the same depth for both bipolar and field effect transistor regions; said insulating sidewall layer being only on said vertically sided openings and being directly above said thermal silicon dioxide regions;
  lightly doped regions of said one conductivity directly under said thermal silicon dioxide regions;
  means for connecting the remaining elements of said transistors; and
  electrical contact means to said elements to form said integrated circuit structure.

7. The integrated circuit structure of claim 6 wherein said conductive layer is N+ polycrystalline silicon, and said heavily doped source/drain regions are N+, and said lightly doped regions are N−.

8. The structure of claim 6 wherein the said field effect transistors are CMOS, said bipolar transistors are PNP and an N− region is located below the P+ emitter region in said bipolar transistors.

9. The structure of claim 6 wherein there is an intrinsic base region under the emitter of said bipolar transistors and said intrinsic base region has an implant dose of between about $1 \times 10^{13}$ to $1 \times 10^{14}$ atoms/cm$^3$.

10. The self aligned bipolar—MOS field effect transistor integrated circuit structure of claim 6 wherein said silicon oxide regions were formed after the formation of said heavily doped regions by a thermal oxidation that consumed a portion of said heavily doped regions at their surface which results in said lightly doped regions.

* * * * *